July 11, 1961 WOO F. CHOW 2,992,328
CRYSTAL CONTROLLED HIGH FREQUENCY CONVERTER
Filed Aug. 1, 1958
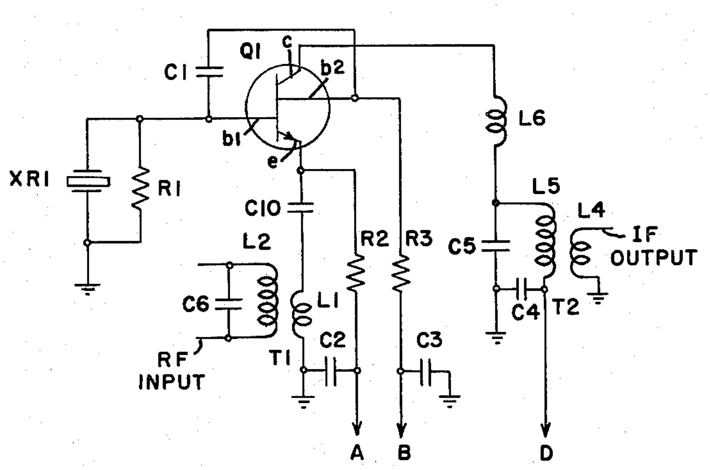
INVENTOR:
WOO F. CHOW,
BY Joseph P. Kates
HIS ATTORNEY.

United States Patent Office 2,992,328

Patented July 11, 1961

2,992,328

CRYSTAL CONTROLLED HIGH FREQUENCY CONVERTER

Woo F. Chow, Syracuse, N.Y., assignor to General Electric Company, a corporation of New York Filed Aug. 1, 1958, Ser. No. 752,530

3 Claims. (Cl. 250—20)

The present invention relates to a crystal controlled transistor converter and oscillator and more particularly relates to a single crystal controlled junction transistor stage converter oscillator which will provide the dual functions of performing as a crystal controlled high frequency oscillator and of conversion of a radio frequency signal to an intermediate frequency signal thereby saving one transistor and its associated circuit components.

Prior art frequency converters utilizing transistors have been known, however, such converters had disadvantages in requiring greater amount of circuitry, they were not crystal controlled and hence did not meet rigid requirements for close frequency tolerances over a relatively large range of ambient temperatures and supply voltage and they did not readily lend themselves to use in double conversion superheterodyne receivers because they required more than one stage to fulfill the functions of an oscillator and also of a converter.

In addition, prior art devices, for example, the patented devices of Wallace, Re. 24,183; Goodrich, Patent No. 2,816,220; Van Overbeek, Patent No. 2,775,705; Rack, Patent No. 2,476,323; Haegele, Patent No. 2,713,117; Chesus et al., Patent No. 2,631,229 and Urtel, Patent No. 2,049,677, had the disadvantages of self oscillation being sustained by feedback from the collector to the emitter or from tuned resonant circuits and required specific structural characteristics of the transistor to be used.

The present invention overcomes these and other disadvantages of the prior art and provides for a crystal controlled oscillator and converter in a single stage wherein close tolerances of frequency and minimum performance changes with changes in ambient conditions of supply and voltage temperature will be effected and provides for an economical circuit which may be operated at high stability at the mode of the crystal or at harmonics of that mode. As stated, the present invention performs with a single transistor a plurality of functions heretofore requiring at least two transistor circuits or two stages.

Accordingly, an object of the present invention is to provide a transistor crystal controlled converter and oscillator which provides for maximum utilization of an input signal.

Another purpose of the present invention is to provide a crystal controlled transistor converter which will perform the functions of circuits which heretofore utilized more than one transistor and wherein a single stage will act as an oscillator with internal feedback in a region between the emitter and a base, and will also act as a converter by beating in that region input transformer coupled energy externally of said region but between its elements.

Another aim of the present invention is to provide a crystal controlled transistor oscillator having other functions which will be of stable configuration and closely controlled frequency output tolerance desipte relatively wide variations in power supply and in ambient temperature.

Another object of the present invention is to provide a crystal controlled transistor oscillator which will have the advantages of the parallel crystal and resistor circuit disposed between the base and the emitter and yet which will have additional radio frequency input circuitry therebetween which will enable the circuit to function also as a converter.

Another aim of the present invention is to provide a crystal controlled transistor converter and oscillator which will be especially suitable for use in superheterodyne receivers and particularly in such receivers utilizing double conversion for step down conversion from a relatively high radio frequency to a relatively low intermediate frequency.

Another object of the present invention is to provide a means and a method for combining functions of oscillation and conversion in a single stage in a manner to increase efficiency and present improved conversion gain.

While the novel and distinctive features of the invention are particularly pointed out in the appended claims, a more expository treatment of the invention, in principle and in detail, together with additional objects and advantages thereof, is afforded by the following description and accompanying drawings in which:

The single figure is a schematic representation of a preferred embodiment of the crystal controlled transistor converter oscillator of the present invention.

In accordance with the present invention radio frequency input is inductively coupled to a series inductance in a series inductor-capacitor emitter circuit. The frequency of oscillation is controlled by a crystal in the base circuit and a small inductance is placed in series with a small capacitance in the emitter circuit and this series circuit in the emitter circuit oscillates at a higher frequency than the crystal and so presents a capacitive reactance. The value of the inductance is such that the series impedance of the capacitance and inductance is still capacitive at the oscillator frequency. This inductance is used as the secondary winding for a radio frequency input transformer. The output is taken from a tuned circuit in the collector circuit, the tuned circuit being resonant at the beat frequency of the radio frequency input and the local oscillator. Thus, a single signal translating device such as the junction transistor can function both as an oscillator and a converter.

The present invention presents an improvement over my prior application entitled, "Crystal Controlled High Frequency Transistor Oscillator," patent application Serial No. 742,941, filed June 18, 1958 and assigned to the General Electric Company. The circuit of the present invention acts in accordance with the teachings of the invention of that patent application to cause oscillation in the circuit and provides additional circuitry combined therewith to provide for mixing in the same stage.

Referring to the figure, a transistor Q1 may be provided which transistor may be a tetrode junction transistor. Other types of transistors could be provided with attendant modification of circuitry. The transistor Q1 may comprise a collector *c*, a first base *b1*, a second base *b2* and an emitter *e*. Disposed between the base *b1* and ground may be a crystal XR1 and a resistor R1 in parallel. An inductor of relatively small inductance L1 may be connected in series with a capacitor C10 of small capacitance in the emitter *e* circuit. The value of inductor L1 may be such that the series resonant frequency of capacitor C10 and inductor L1 is much higher than the crystal frequency XR1 or the frequency of oscillation. Therefore, the series combination of capacitor C10 and inductor L1 presents a capacitive reactance at the frequency of oscillation. An inductor L2 and a capacitor C6 may be provided, inductor L2 and inductor L1 together forming a transformer T1 to couple radio frequency energy into the emitter *e* circuit. Across the inductor L2 may be provided input radio frequency energy which will be inductively coupled to inductor L1. Capacitor C10 may be in series with emitter *e* and in turn inductor L1 may be disposed between capacitor C10 and ground. Connected to the emitter *e* may be an emitter resistor R2 which may serve to provide for predetermined emitter current from source A. By-pass to ground may be provided by capacitor C2 disposed between ground and the end of resistor R2 connected to emitter current source A. A second base $b2$ may be provided in the tetrode junction transistor Q1 and may be biased by a suitable source B with an appropriate dropping resistor R3 disposed between the base $b2$ and the source B. A tank circuit comprising an inductor L5 and a capacitor C5, chosen to be parallel resonant at the intermediate frequency may be provided in series with an inductor L6 in turn connected to the collector $c$ of transistor Q1. Intermediate frequency output may be taken by the secondary winding or inductor L4 which may with inductor L5 comprise a transformer T2. As hereinbefore stated a transformer T1 will be provided by the inductor L2 as a primary winding and the inductor L1 as a secondary winding. A bypass capacitor C1 may be disposed between the first base $b1$ and the second base $b2$ of transistor Q1. A bypass capacitor C4 may be disposed in the output circuit between ground and one end of the inductor L5 at the junction point between that end of the inductor L5 and a bias source D provided for appropriate collector supply voltage.

As stated the inductance of inductor L5 and the capacitance of capacitor C5 are chosen to be parallel resonant at the intermediate frequency. The intermediate frequency output appears across inductor L4 which is inductively coupled to inductor L5. Capacitors C1, C2, C3 and C4 are by-pass capacitors or condensers. The capacitance of capacitor C5 should be large enough to give negligible reactance at the frequency of oscillation.

Since the circuit component values may be such that, at the frequency of oscillation, there is practically no change in the oscillator of my prior invention hereinbefore described, the circuit of this invention will oscillate as in that invention. The amplitude of oscillation is normally large. It swings into the non-linear region of the emitter base diode (and often into the cut-off region of the emitter base diode as indicated by the decrease of emitter bias current during oscillation) producing mixing action. The radio frequency (R.F.) signal fed from the radio frequency input across capacitor C6 and transformer coupled into inductor L1 beats with the frequency of oscillation in transistor Q1 to thereby form an output intermediate frequency across the output tank circuit comprising capacitor C5 and inductor L5. It will be understood that upon beating or heterodyning of the oscillator frequency with the input radio frequency in the input diode between the emitter $e$ and base $b1$ outputs may be formed which may be either the sum of these frequencies or their difference as well as the input R.F. and oscillator frequencies. The frequency to which the output tank of inductor L5 and capacitor C5 is resonant will determine the intermediate frequency. In this manner a single stage crystal controlled oscillator converter or oscillator mixer is enabled to produce an intermediate frequency with maximum stability and good gain characteristics.

While in nowise to be construed as limiting the invention the following component values were utilized in a successful experimental embodiment of the invention.

C1, C2, C3, C4=.01 $\mu$f. (microfarads)
C5=750 $\mu\mu$f. (micromicrofarads)
C6=10 $\mu\mu$f. (micromicrofarads)
C10=20 $\mu\mu$f. (micromicrofarads)
R1=6.6 K ohms
R2=4.8 K ohms
R3=4.7 K ohms
L1=.5 $\mu$h. (microhenries)
L2=2 $\mu$h. (microhenries)
L4=1 $\mu$h. (microhenry)
L5=5 $\mu$h. (microhernies)
L6=1 $\mu$h. (microhenry)
* K=1,000
$\mu$=one millionth In accordance with transistor circuit design the following were the voltages used in the above embodiment at A, B and C:

$A=-6$ volts (a current of about 1.25 milliamperes or in the approximate range of 1.00 to 1.50 milliamperes is preferable)
$B=-0.5$ volt
$C=+12$ volts The crystal used was in one case 33.208 megacycles (mc.) and in another case 39.84 megacycles (mc.). The radio frequency utilized was 35.8 megacycles in the one case and 42.44 megacycles in the other case. The intermediate frequency was 2.6 megacycles, and using a General Electric ZJ7–2 tetrode transistor, a conversion gain of 6 decibels was obtained. No adjustment of the circuit was necessary for the oscillator function when the crystal frequency was changed.

Thus there is shown a crystal controlled high frequency single stage oscillator converter of satisfactory conversion gain and stability utilizing a minimum of circuit elements.

While the principles of the invention have now been made clear, there will be immediately obvious to those skilled in the art many modifications in structure, arrangement, proportions, the elements and components used in the practice of the invention, and otherwise, which are particularly adapted for specific environments and operating requirements without departing from those principles. The appended claims are therefore intended to cover and embrace any such modifications within the limits only of the true spirit and scope of the invention.

What I claim is:

1. A converter oscillator comprising a crystal controlled junction transistor oscillator stage, said stage comprising a series inductor-capacitor emitter circuit and means to inject radio frequency energy into said oscillator between the emitter and a base of said transistor, said radio frequency energy being inductively coupled to said series inductor, said means to inject radio frequency energy comprising transformer coupling to provide radio frequency energy into said transistor, said series circuit being resonant at a higher frequency than the crystal operating frequency to present a total capacitor circuit at the oscillator frequency and means to provide intermediate frequency energy output.

2. A single stage combined converter and oscillator, said stage comprising a junction transistor including an input diode, means to couple radio frequency energy into said input diode, an input crystal controlled circuit, means to operate said transistor to cause oscillations in accordance with said crystal controlled circuit, said oscillations being combined with said radio frequency input in said input diode to cause output at an intermediate frequency and means to operate said crystal controlled circuit between the series resonant mode and the parallel resonant mode of the crystal.

3. A method of producing oscillation and conversion in a single signal translating device comprising generating oscillation in said signal translating device, crystal controlling said oscillations to close frequency tolerance, operating said signal translating device between the series resonant mode and the parallel resonant mode of said crystal, injecting radio frequency energy into said signal translating device and heterodyning said radio frequency energy and said oscillations within said signal translating device to provide an output comprising energy at the frequencies of said oscillations, said radio frequency, the sum of said last-mentioned two frequencies and the difference between said radio frequency and the frequency of said oscillations.

(References on following page)

References Cited in the file of this patent

UNITED STATES PATENTS

| | | |
|---|---|---|
| 2,775,705 | Van Overbeek | Dec. 25, 1956 |
| 2,777,950 | Doremus | Jan 15, 1957 |
| 2,797,328 | Miller | June 25, 1957 |
| 2,811,646 | Yin | Oct. 29, 1957 |
| 2,825,813 | Sperling | Mar. 4, 1958 |
| 2,880,312 | Koch | Mar. 31, 1959 |
| 2,887,573 | Hruska | May 19, 1959 |
| 2,932,735 | Herold | Apr. 12, 1960 |

FOREIGN PATENTS

| | | |
|---|---|---|
| 1,048,664 | France | Aug. 5, 1953 |